(12) United States Patent
Huang et al.

(10) Patent No.: US 11,519,950 B2
(45) Date of Patent: Dec. 6, 2022

(54) BURN-IN CHAMBER

(71) Applicant: Accton Technology Corporation, Hsinchu (TW)

(72) Inventors: Hsu-Cheng Huang, Taoyuan (TW); Teng-Jung Chang, Taoyuan (TW); Hong-Yu Hu, Hsinchu (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 256 days.

(21) Appl. No.: 16/820,239

(22) Filed: Mar. 16, 2020

(65) Prior Publication Data
US 2021/0011070 A1  Jan. 14, 2021

(30) Foreign Application Priority Data
Jul. 9, 2019 (TW) ................................. 108124070

(51) Int. Cl.
*G01R 31/00* (2006.01)
*G01R 31/56* (2020.01)

(52) U.S. Cl.
CPC ............ *G01R 31/003* (2013.01); *G01R 31/56* (2020.01)

(58) Field of Classification Search
None
See application file for complete search history.

(56) References Cited

U.S. PATENT DOCUMENTS

| | | | | |
|---|---|---|---|---|
| 5,851,143 A | * | 12/1998 | Hamid | G11B 33/128 454/57 |
| 6,208,510 B1 | * | 3/2001 | Trudeau | H05K 7/20609 324/750.09 |
| 7,084,655 B2 | * | 8/2006 | Min | G01R 31/286 324/750.05 |
| 2005/0179457 A1 | * | 8/2005 | Min | G01R 31/2877 324/750.05 |

FOREIGN PATENT DOCUMENTS

| | | | | |
|---|---|---|---|---|
| JP | 2014105996 A | * | 6/2014 | ............. G01R 31/26 |
| TW | 200521443 A | * | 7/2005 | ......... G01R 31/2862 |

* cited by examiner

*Primary Examiner* — Jermele M Hollington
(74) *Attorney, Agent, or Firm* — Birch, Stewart, Kolasch & Birch, LLP

(57) ABSTRACT

A burn-in chamber is provided, configured to provide the required temperature for a device under test (DUT), including a side wall, a guiding plate, an air flow plate, a partition assembly, and a fan. The air flow plate has a ventilation structure, and the guiding plate is located between the side wall and the air flow plate. The partition assembly is disposed on both sides of the air flow plate. The partition assembly and the air flow plate together form an accommodating space for accommodating the DUT. The partition assembly forms a return channel with respect to the other side of the accommodating space with the side wall. When the fan is active, air from the accommodating space passes through the air flow plate and is guided to the return channel via the guiding plate, and air is returned to the accommodating space through the return channel.

20 Claims, 9 Drawing Sheets

BURN-IN CHAMBER

CROSS REFERENCE TO RELATED APPLICATIONS

This application claims the benefit of TW Application No. 108124070, filed on Jul. 9, 2019, the entirety of which is incorporated by reference herein.

BACKGROUND OF THE INVENTION

Field of the Invention

The application relates in general to a burn-in chamber, and in particular to a burn-in chamber that includes a guiding plate and an air flow plate.

Description of the Related Art

Conventional walk-in chambers use a number of heaters to heat the air to bring the chamber to a predetermined temperature. They have several exhaust fans to maintain the predetermined temperature within the chamber, which makes the conventional walk-in chamber consume a lot of power to maintain the temperature inside the chamber. Since the walk-in chamber uses heaters to reach a predetermined temperature, a large amount of power is consumed, which is not only expensive to use, but may not be able to evenly heat each product to be tested to a predetermined temperature. Therefore, how to provide a uniform temperature in the chamber and use the waste heat generated by the product or the device to be tested as a heat source to achieve energy savings is an important issue.

BRIEF SUMMARY OF INVENTION

To address the deficiencies of the conventional products, an embodiment of the invention provides a burn-in chamber configured to provide the required temperature for a device under test (DUT), including a side wall, a guiding plate, an air flow plate, a partition plate assembly, and a fan. The air flow plate has a ventilation structure, and the guiding plate is located between the side wall and the air flow plate. The partition plate assembly is disposed on both sides of the air flow plate. The partition plate assembly and the air flow plate together form a receiving space for accommodating the DUT. The partition plate assembly forms a return channel with respect to the other side of the receiving space with the side wall, and the fan is disposed in the return channel. When the fan is active, air from the receiving room passes through the air flow plate and is guided to the return channel via the guiding plate, and air is returned to the receiving space through the return channel.

In some embodiments, the air flow plate further has a ventilation structure inclined with respect to an air inlet direction.

In some embodiments, the ventilation structure extends toward the bottom side of the guiding plate.

In some embodiments, the guiding plate has a triangular surface, and a vertex of the triangular surface is adjacent to the air flow plate.

In some embodiments, the guiding plate is a triangular column structure, wherein a cross section of the triangular column structure is the triangular surface, and the vertex of the triangular surface which is adjacent to the air flow plate is an obtuse angle.

In some embodiments, the burn-in chamber further comprises a heater assembly disposed in the return channel.

In some embodiments, the side wall includes a first wall, a second wall and a third wall, wherein the first wall is located between the second wall and the third wall and connected to the second and third walls, and the guiding plate is located between the first wall and the air flow plate.

In some embodiments, the burn-in chamber further comprises an extractor fan assembly, wherein the side wall further includes an upper wall located above the first wall, the second wall and the third wall, and the extractor fan assembly is disposed on the upper wall for extracting air in the burn-in chamber.

In some embodiments, two junctions between the first wall and the second wall and between the first wall and the third wall are a rounded structure, for guiding air from the guiding plate to the return channel.

In some embodiments, the guiding plate and the air flow plate form a flow channel.

In some embodiments, the second wall and the third wall each have a vent that is connected to the return channel, and the vents are configured to introduce air from outside the burn-in chamber into the burn-in chamber.

In some embodiments, the guiding plate has a guiding curved surface for guiding air into the return channel.

In some embodiments, the air is provided by the device under test which is placed in the accommodating space.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
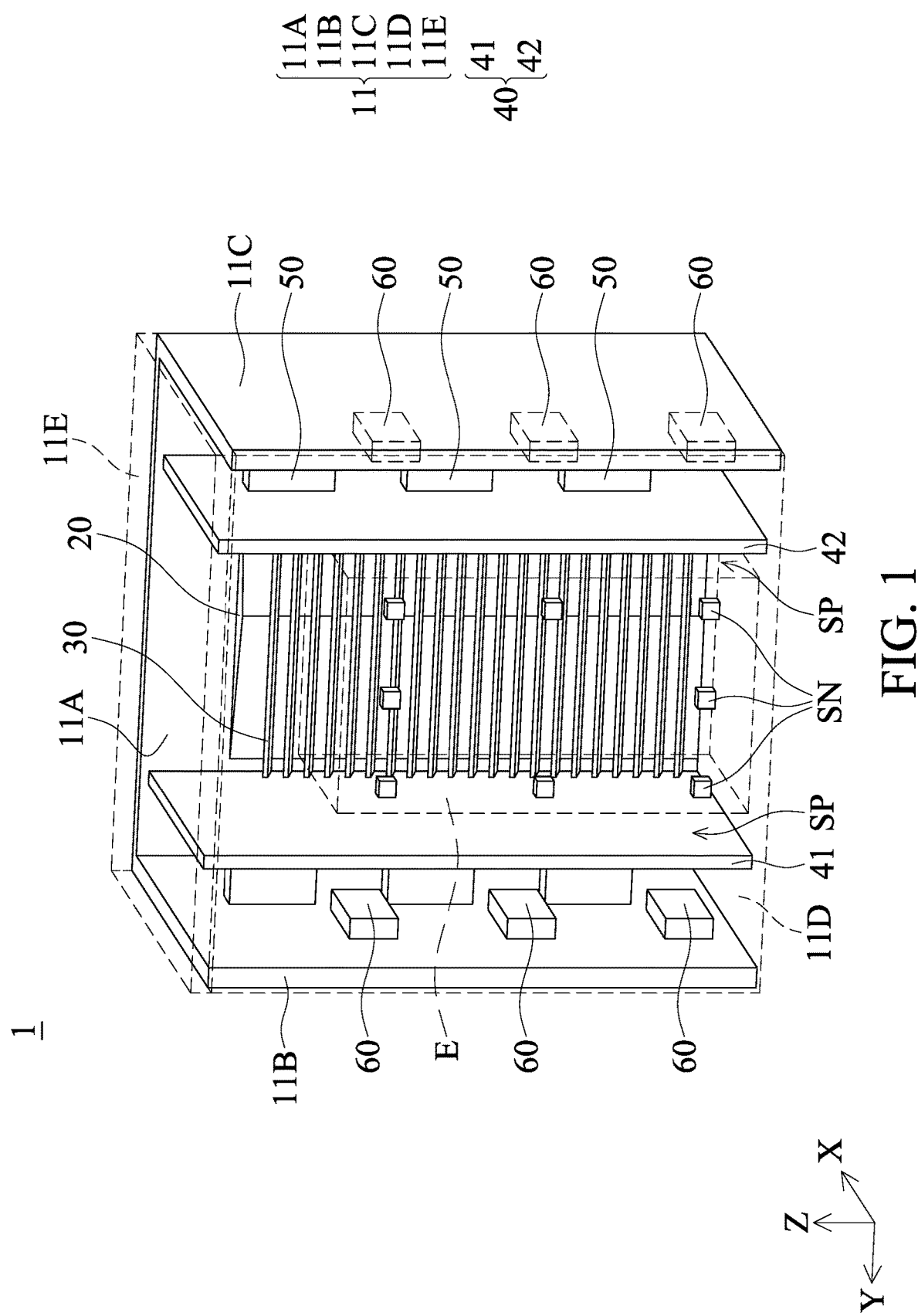
FIG. 1 is a schematic diagram of a burn-in chamber according to an embodiment of the present invention.

Please refer to FIG. 1, which is a schematic diagram of a burn-in chamber 1 according to an embodiment of the present invention. As shown in FIG. 1, the burn-in chamber 1 can accommodate a device under test (DUT) E therein, and can adjust temperature to simulate the environmental conditions of the device under test E to be tested for quality, product testing, and experiment and other purposes. In some embodiments, a plurality of devices under test E can be placed in the burn-in chamber for test. In this embodiment, the device under test E can be a network switch, a mobile phone, a tablet, a computer, or other electronic device that needs to perform quality inspection, testing, and experimentation.

In the present embodiment, the burn-in chamber 1 includes a guiding plate 20, an air flow plate 30, a partition assembly 40, a circulating fan assembly 50, and a heater assembly 60. In this embodiment, the burn-in chamber 1 has a side wall 11, wherein the side wall 11 includes a first wall 11A, a second wall 11B, a third wall 11C, a fourth wall 11D and a fifth wall (or called an upper wall) 11E. The aforementioned walls 11A to 11E form a receiving space for the device under test E and the flow guiding elements and components (such as the guiding plate 20, the air flow plate 30, the partition assembly 40, the circulating fan assembly 50, and the heater assembly 60) being placed therein, for testing or experimentation. It should be understood that the fourth wall 11D, the fifth wall 11E, and the device under test E in FIG. 1 are depicted by broken lines to clearly show the internal structure of the burn-in chamber 1, wherein the fourth wall 11D can be used as a switch door, to conveniently place the device under test E and inspect or repair components in the burn-in chamber 1.

Figure 2A:
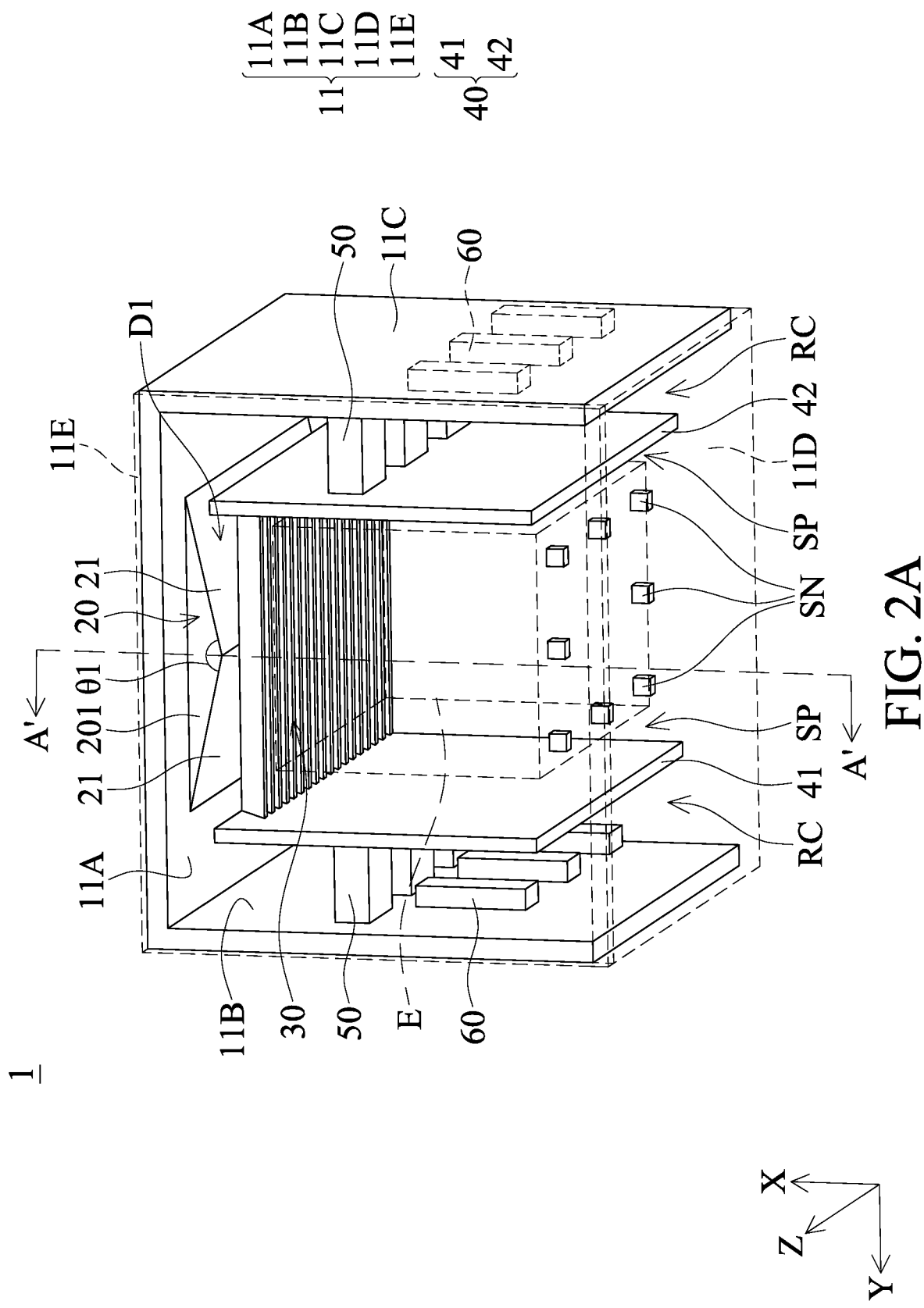
FIG. 2A is a top perspective view diagram of the burn-in chamber in FIG. 1.

Please refer to FIG. 1 and FIG. 2A. FIG. 2A is a perspective top view diagram of the burn-in chamber 1, wherein the fourth wall 11D and the fifth wall 11E are shown by broken lines to clearly show the inside of the burn-in chamber 1. The guiding plate 20 is disposed on the first wall 11A of the side wall 11, and the air flow plate 30 is disposed between the guide plate 20 and the first wall 11A of the side wall 11, and is closer to the fourth wall 11D than the guide plate 20. The guide plate 20 is located between the air flow plate 30 and the first wall 11A. In some embodiments, the guide plate 20 is integrally formed with the first wall 11A and disposed opposite the air flow plate 30, that is, the first wall 11A can be regarded as the other side of the guide plate 20 relative to the air flow plate 30. The partition assembly 40 is located on a side of the guide plate 20 which faces the air flow plate 30 and is disposed on both sides of the air flow plate 30. In detail, the partition assembly 40 has a first partition 41 and a second partition 42, and the air flow plate 30 is disposed therebetween to mutually form an accommodating space SP, in which the device under test E may be placed.

Continuing to refer to FIG. 2A, the partition assembly 40 is disposed on both sides of the air flow plate 30, and the other side of the partition assembly 40 with respect to the accommodating space SP forms a return channel RC with the side wall 11. Specifically, the first and second partitions 41 and 42 of the partition assembly 40 sandwich the air flow plate 30 therebetween and are parallel or substantially parallel to the second and third walls 11B and 11C of the side wall 11, and the return channel RC is formed between the assembly 40 and the second wall 11B and third walls 11C. Furthermore, a flow channel D1 is formed between the guide plate 20 and the air flow plate 30. The flow channel D1 allows air flow pass through the air flow plate 30 and guided by the guiding plate 20, and then arrive the return channel RC.

Figure 2B:
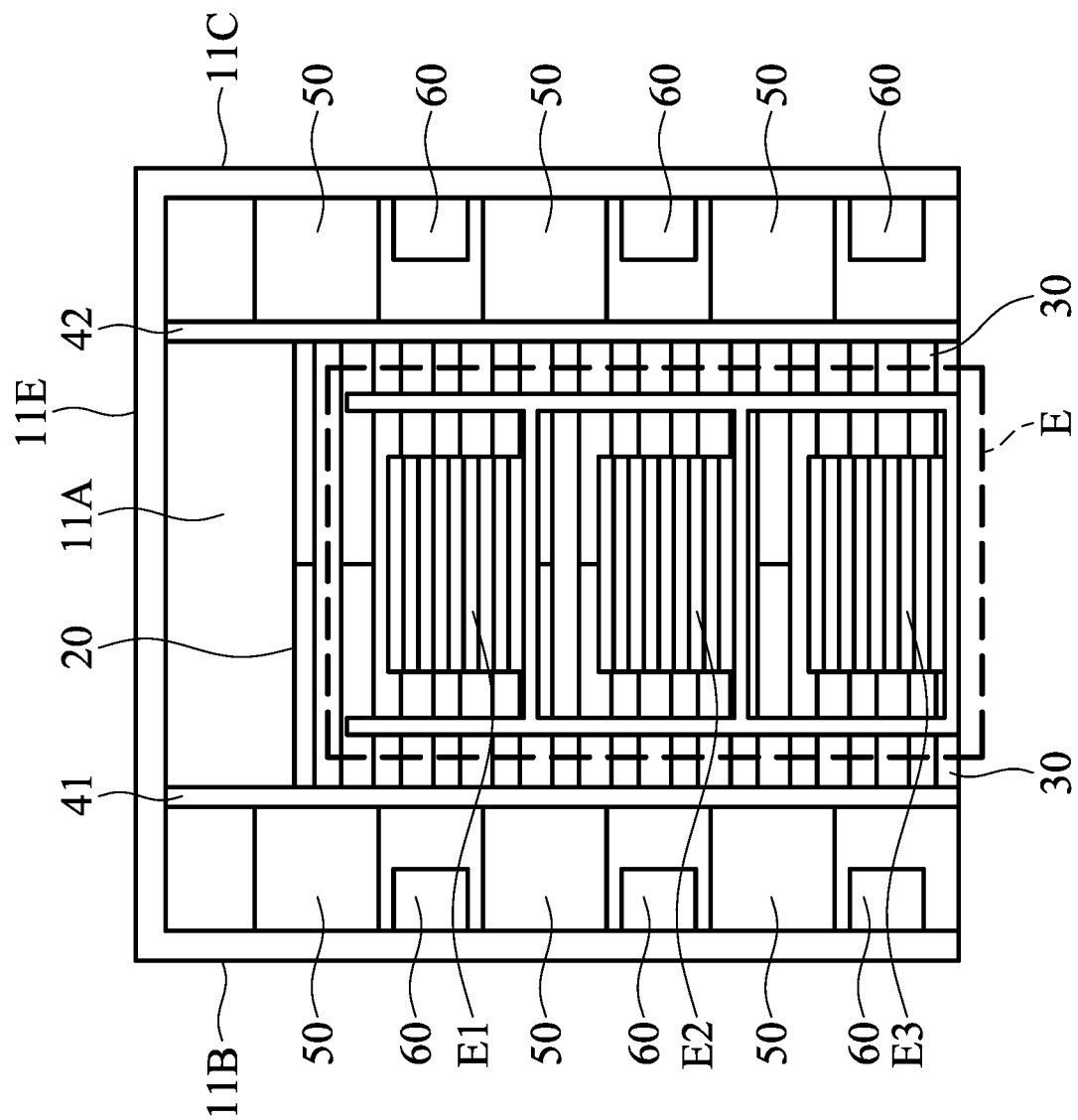
FIG. 2B is a schematic diagram of the detail structure of the device under test (DUT) which is disposed in the burn-in chamber.

Please refer to FIG. 2B, which is a schematic diagram showing the device under test E placed in the accommodating space SP. In this embodiment, the device under test E may include a plurality of sub-devices under test E1, E2, and E3 placed in the burn-in chamber 1, for example, a plurality of network switches or other electronic devices placed in the burn-in chamber 1, and the corresponding temperature is provided by the burn-in chamber 1 in response to a designated environment or purpose. In other embodiments, the device under test E may include any number of devices which need to be tested, or one larger device under test E is placed in the burn-in chamber 1 for testing.

Please refer to FIG. 2A again. In the embodiment, the guiding plate 20 is a triangular column structure which has a triangular surface 201, wherein the triangular surface 201 has an obtuse angle θ1, and a vertex of the triangular surface 201 is adjacent/close to the air flow plate 30. In some embodiments, the (obtuse) angle θ1 ranges from 110 to 165 degrees. The guiding plate 20 includes a flow guiding surface 21 which is inclined with respect to the air flow plate 30, and extends toward the second and third walls 11B and 11C to be inclined with respect to the first wall 11A. The flow guiding surface 21 and the air flow plate 30 constitute the flow channel D1, which is configured to guide the air to flow.

Figure 3:
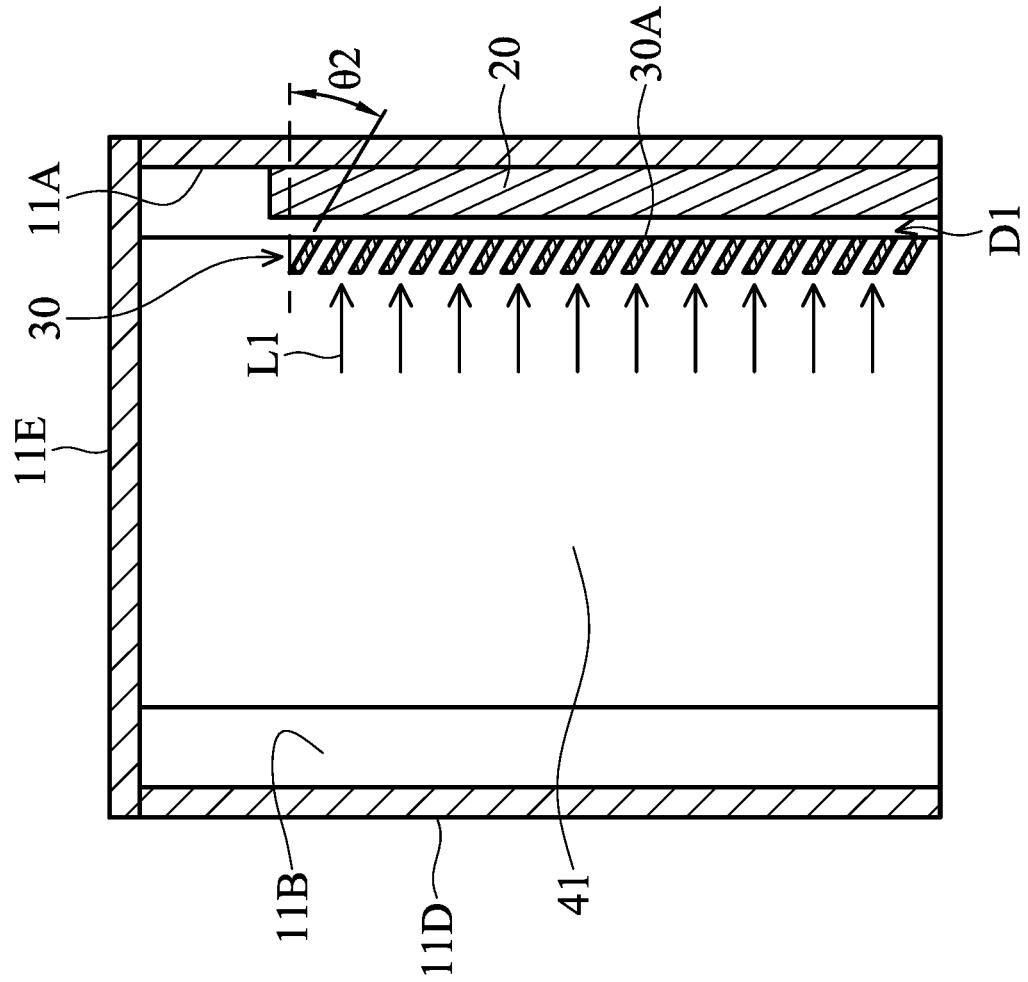
FIG. 3 is a cross-sectional view taken along the line A'-A' in FIG. 2A (the device under test is omitted).

Next, please refer to FIG. 3, which is a cross-sectional view of the line A'-A' in FIG. 2A. The air flow plate 30 has a ventilation structure 30A which is inclined with respect to an air inlet direction L1. In the present embodiment, the ventilation structure 30A extends toward the bottom side of the air flow plate 30 and is inclined with respect to the air inlet direction L1. In the present embodiment, the air flow plate 30 can be a venetian blind or a ventilation grille, and therefore the ventilation structure 30A is a blade. Specifically, the ventilation structure 30A is inclined with respect to the air inlet direction L1 and extends toward the bottom side of the partition assembly 40 or the air flow plate 30. Therefore, when the air/hot gas (or the heat or gas generated by the device under test E combined) in the accommodating space passes through the ventilation structure 30A, the hot gas is guided to the lower side of the flow channel D1. According to physical phenomenon in which hot gas moves upwards, the situation of hot gas concentrated to upper area of the flow channel D1 can be prevented by the ventilation structure 30A, so that the hot gas is more evenly distributed through the flow channel D1. Compared with a ventilation structure parallel to the air inlet direction L1, the present embodiment can prevent the hot gas from being concentrated to upper area of the flow channel D1, and avoid the temperature difference between the upper and lower portions being too large. In some embodiments, the ventilation structure 30A and the fifth wall 11E are inclined at an angle θ2 of 5 to 15 degrees.

Figure 4:
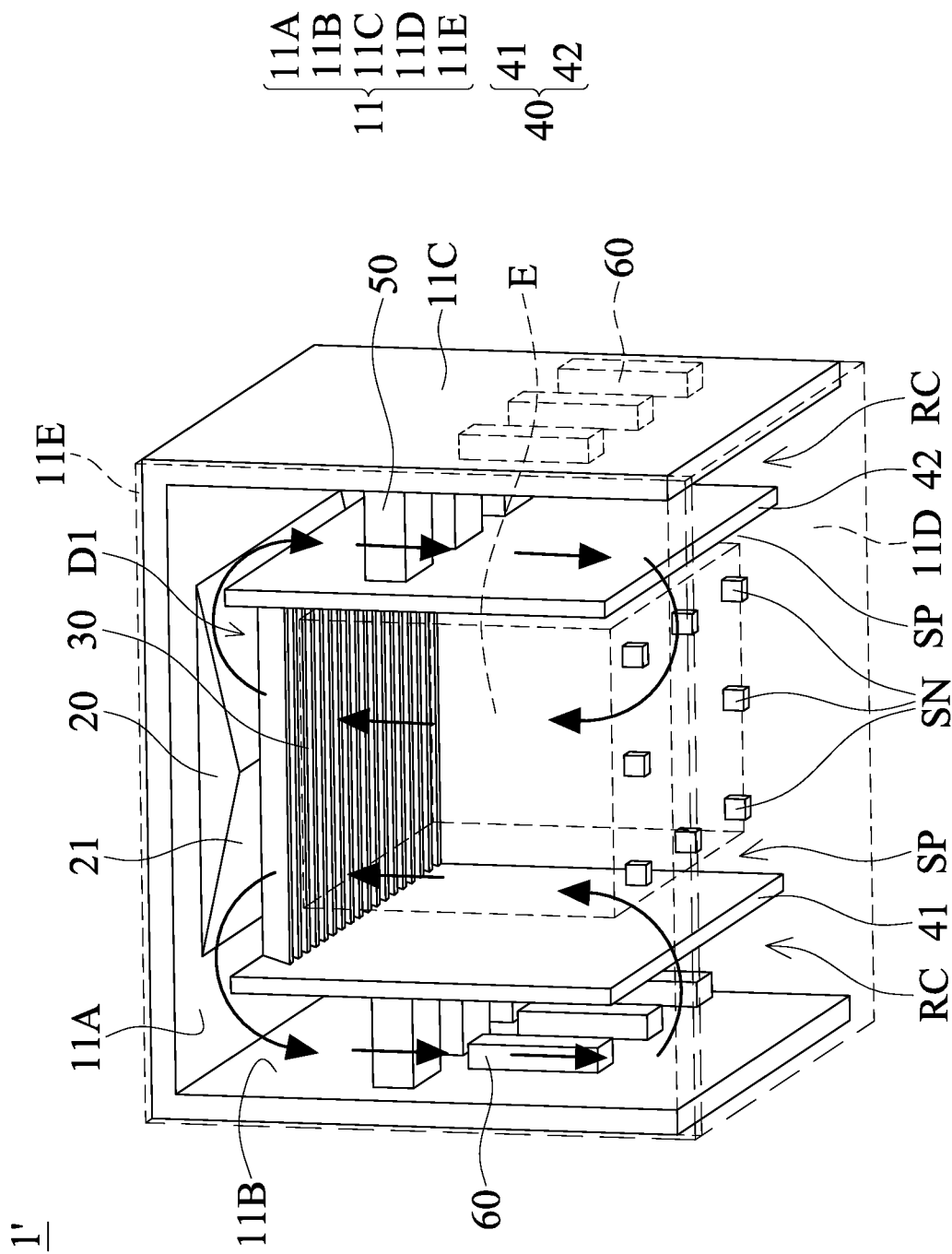
FIG. 4 is schematic diagram of the flow of hot gas from the device under test in the burn-in chamber.

Regarding the air/hot gas flow path in the present embodiment, please refer to the arrow designations in FIG. 4. When the circulating fan assembly 50 is operated, the hot gas generated by the device under test E passes through the ventilation structure 30A of the air flow plate 30 to the guiding plate 20, and the hot gas from the device under test E flows down via the ventilation structure 30A to the flow channel D1 since the ventilation structure 30A is inclined downward with respect to the air inlet direction L1. The flow guiding surface 21 of the guiding plate 20 guides the hot gas generated from the device under test E to flow to both sides of the burn-in chamber 1. Then, the hot gas enters the return channel RC and is again driven by the circulating fan assembly 50 to move toward the fourth wall 11D of the side wall 11, and the hot gas returns to the accommodating space SP where the device under test E is placed by the fourth wall 11D. As a result, the hot gas generated by the device under test E will be effectively recycled.

In addition, the burn-in chamber 1 further comprises a sensor assembly SN, for detecting/sensing the temperature inside the burn-in chamber 1, which can be disposed adjacent to the device under test E. Referring to FIGS. 1 and 2A, the sensor assembly SN can be disposed on a side where the device under test E is subjected to the wind. In some embodiments, the sensor assembly SN is disposed on the fourth wall 11D. The heater assembly 60 is disposed in the return channel RC for heating the gas passing through the return channel RC, and the sensor assembly SN can be electrically connected to the heater assembly 60. When it is sensed that the temperature in the burn-in chamber 1 is less than a predetermined temperature, the sensor assembly SN generates a signal correspondingly, and the heater assembly 60 starts to heat up corresponding to the signal. This allows the burn-in chamber 1 to be maintained at the predetermined temperature condition.

It should be noted that, in this embodiment, the circulating fan assembly 50 and the heater assembly 60 respectively include a plurality of circulating fan elements and a plurality of heater elements, and are disposed on the second and third walls 11B and 11C. Two sets of three circulating fan elements and heater elements are arranged on the Z-axis, which makes the flow of the gas more stable and improves the uniformity of gas distribution and heating. In some embodiments, the number of circulating fan elements and heater elements included in the circulating fan assembly 50 and the heater assembly 60 may be other suitable numbers, for example, one, two or four, disposed on each wall.

In the present embodiment, the sensor assembly SN includes eight sensor elements, wherein three sensor elements are disposed on the left side of the device under test E, three sensor elements are disposed on the right side of the device under test E, and rest two sensor elements are disposed in the middle of the front of the device under test E. The six sensor elements on left and right may correspond to the aforementioned individual circulating fan elements and heater elements, and the two sensor elements in the middle area sense and monitor the temperature in the intermediate region of the device under test E. In some embodiments, each sensor element corresponds to one circulating fan element and one heater element for an individual turn on/off function. In other embodiments, another suitable number may be included; for example, one sensor element corresponding to the three circulation fan elements and three heater elements.

In some embodiments, the sensor assembly SN, the circulating fan assembly 50, and the heater assembly 60 are electrically connected to a central control unit, and the sensor component SN transmits a signal to inform a current information, such as a temperature information. The central control unit can be configured to turn on/off the circulating fan assembly 50 and heater assembly 60 automatically or manually. In some embodiments, in addition to detecting the temperature inside the burn-in chamber 1, the sensor assembly SN may also provide other information, such as humidity and pressure information, so that various current information in the burn-in chamber 1 can be required. Moreover, the burn-in chamber 1 can be equipped with other corresponding devices, such as a humidity or pressure maintaining device.

Figure 5:
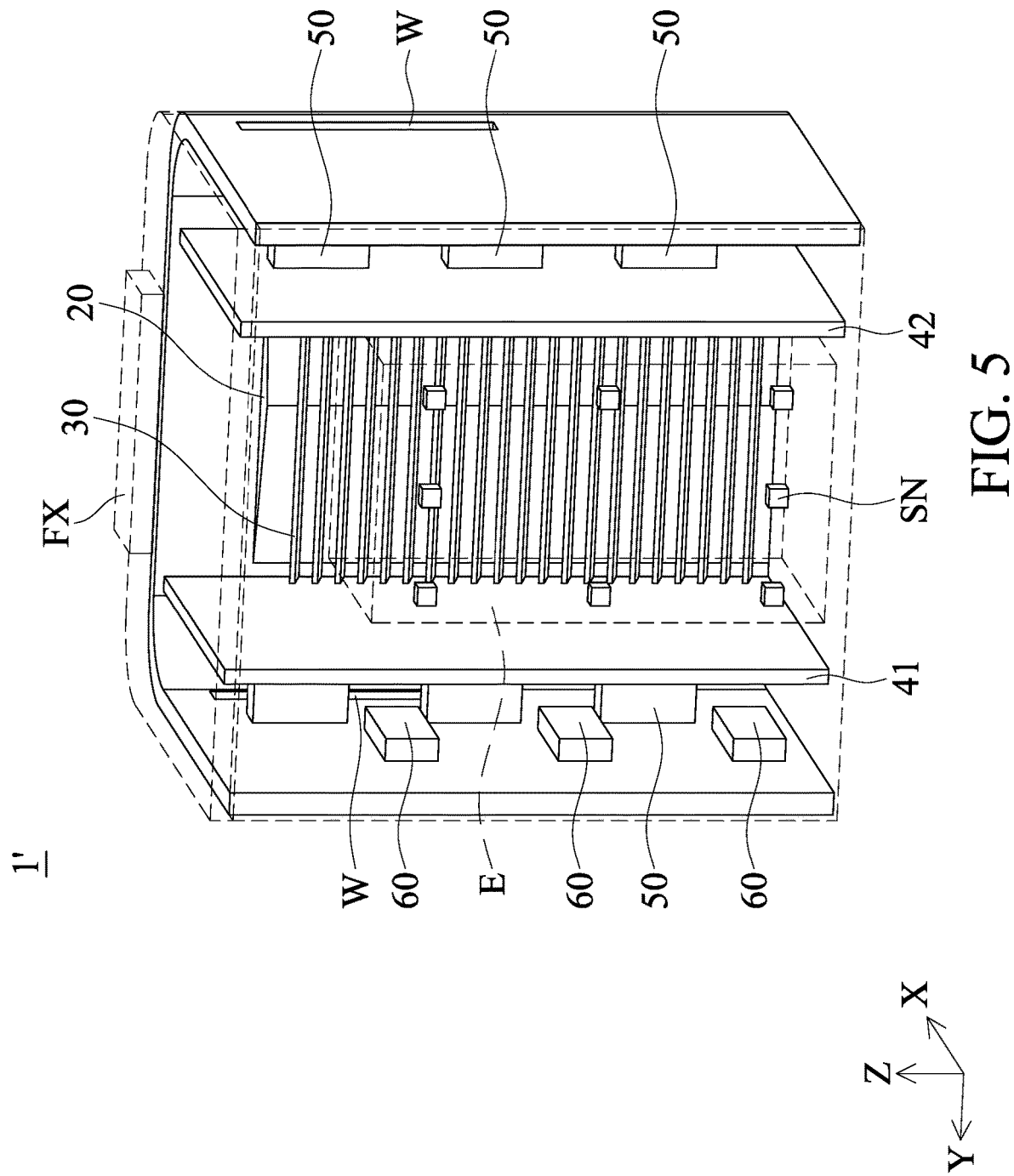
FIG. 5 is a schematic diagram of a burn-in chamber according to another embodiment of the present invention.
Figure 6:
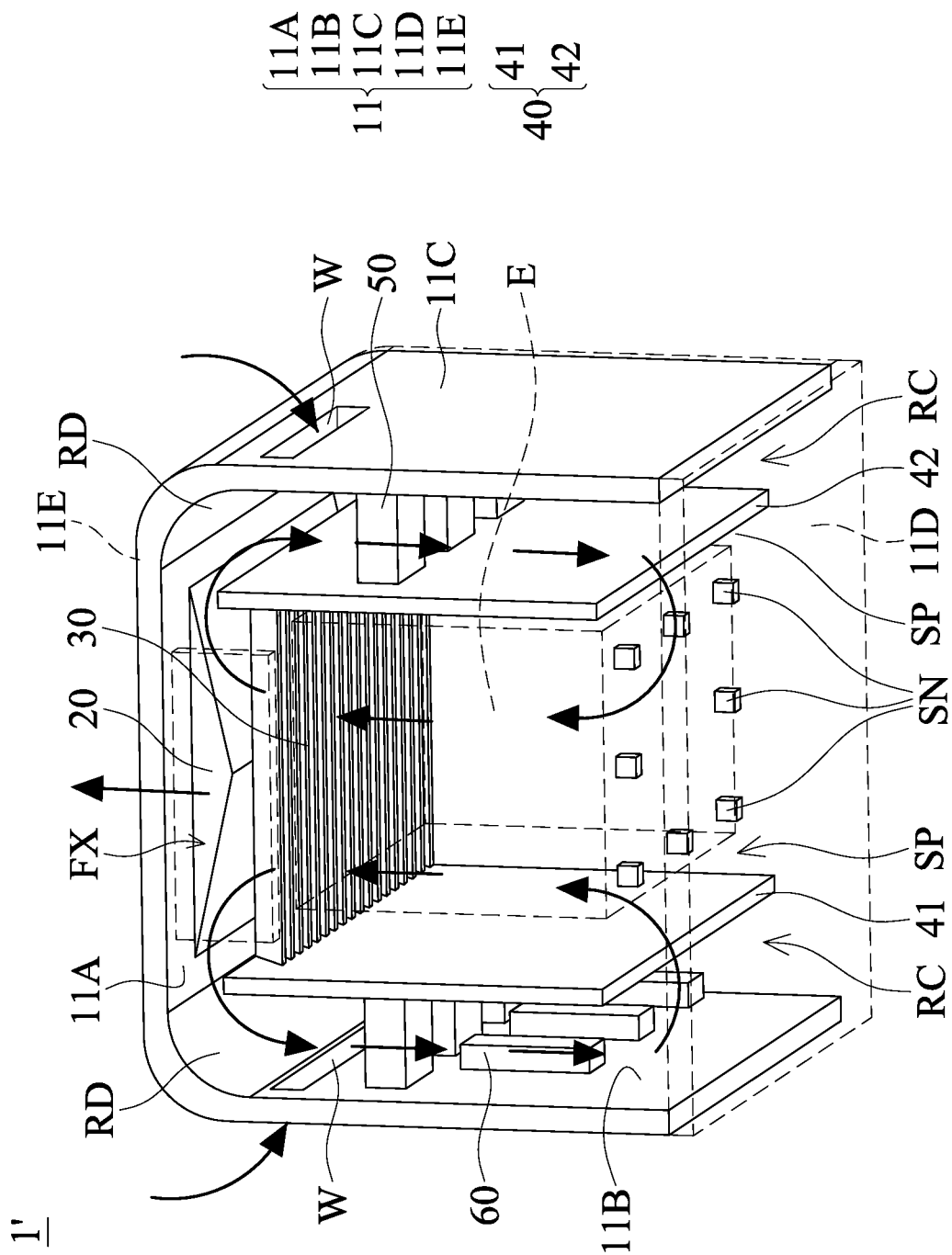
FIG. 6 is a top perspective view diagram of the burn-in chamber in FIG. 5.

FIGS. 5 and 6 show a burn-in chamber 1' according to another embodiment of the present invention. Compared with the burn-in chamber 1 (FIG. 1), the burn-in chamber 1' of the present embodiment is further comprises an extractor fan assembly FX. The extractor fan assembly FX is disposed on the fifth wall 11E of the side wall 11 for extracting the gas (or air) inside the burn-in chamber 1 when the temperature in the burn-in chamber 1 is too high, so as to quickly reduce the inside temperature of the chamber. In detail, when the sensor assembly SN determines that the temperature of the air in the current burn-in chamber 1' is too high, the extractor fan assembly FX will be activated, so that the burn-in chamber 1' can quickly to reach (cool down at) a predetermined temperature.

In other embodiments, as shown in FIGS. 5 and 6, the burn-in chamber 1' further comprises: the side wall 11 having a plurality of vents W. The second and third walls 11B and 11C of the side wall 11 are respectively provided with a vent (or an opening) W, which communicates with the return channel RC, and allows air outside the burn-in chamber 1' to enter. In this embodiment, the vent W can be a switchable vent. In general, the temperature of the air outside the burn-in chamber 1' is lower than the internal gas temperature of the burn-in chamber 1'. Therefore, if the temperature in the burn-in chamber 1' is too high, the vent W can be opened so that the cold air enters the burn-in chamber 1' for cooling down. Thus, if the inside of the burn-in chamber 1' exceeds the predetermined temperature, the extractor fan assembly FX and the vent W can be used to reduce the internal temperature of the burn-in chamber 1', to achieve a cooling effect faster.

In other embodiments, as shown in FIGS. 5 and 6, the burn-in chamber 1' further comprises: the side wall 11 has a rounded structure RD. The rounded structure RD is located at a junction between the first wall 11A and the second wall 11B and at a junction between the first wall 11A and the third wall 11C. The rounded structure RD is configured to guide the hot gas of the device under E from the flow guiding surface 21 of the guiding plate 20 to the return channel RC, so that the uniform distribution of the gas temperature in the burn-in chamber 1' can be more smoothly accelerated. In some embodiments, a rounded structure RD may be also provided at the junctions of the fourth wall 11D and the second and third walls 11B and 11C to facilitate the smooth return of hot gas from the return channel RC to the accommodating space SP.

It should be understood that, compared with the burn-in chamber 1 in FIG. 1, the newly added extractor fan assembly FX, vents W, and the rounded structure RD in FIGS. 5 and 6 may be different or they may be combined with each other to become another embodiment. For example, another burn-in chamber in some embodiments further comprises an extractor fan assembly FX relative to the burn-in chamber 1; in other embodiments, a burn-in chamber is further comprised of vents W relative to the burn-in chamber 1; in other embodiments, a burn-in chamber further comprises a rounded structure RD with respect to the burn-in chamber 1; in other embodiments, a burn-in chamber further comprises an extractor fan assembly FX, vents W and a rounded structure RD relative to the burn-in chamber 1.

Figure 7:
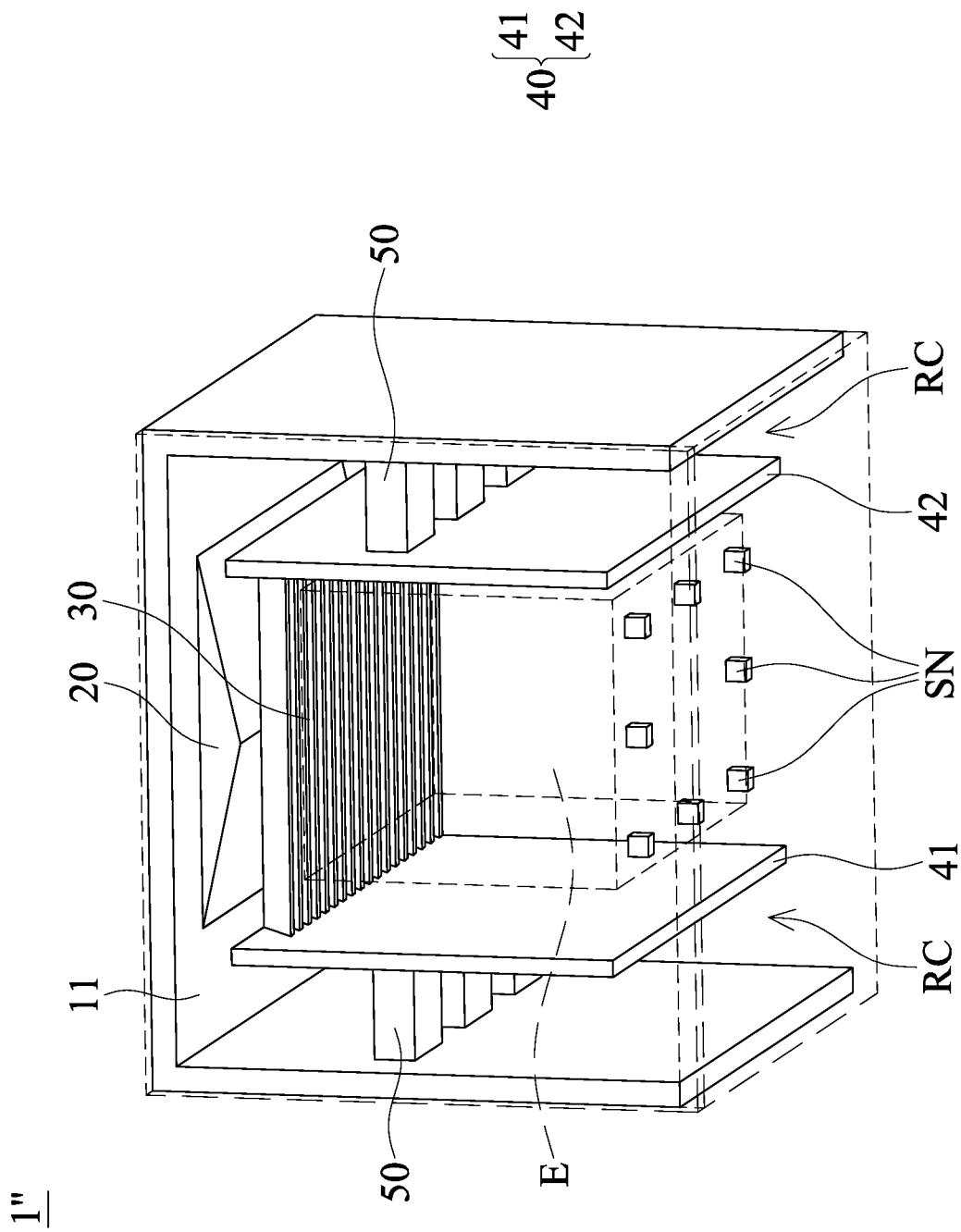
FIG. 7 is a schematic diagram of a burn-in chamber according to another embodiment of the present invention.

FIG. 7 is a schematic diagram showing a burn-in chamber 1" according to another embodiment of the present invention. The main difference between the burn-in chamber 1" and the burn-in chamber 1 (FIG. 2A) is that the burn-in chamber 1" does not include a heater assembly 60. The other components are the same as, or correspond to, the burn-in chamber 1 in FIG. 1 and are designated by the same reference numerals and will not be described again. when the degree of heat generation of the device under test E is already the same as or higher than the predetermined temperature, the heat generated by the device E itself is circulated and can allow the interior of the chamber 1" to reach the predetermined temperature without the heater assembly 60. Therefore, the present embodiment is not provided with a heater assembly, which can significantly save energy and reduce costs.

Figure 8:
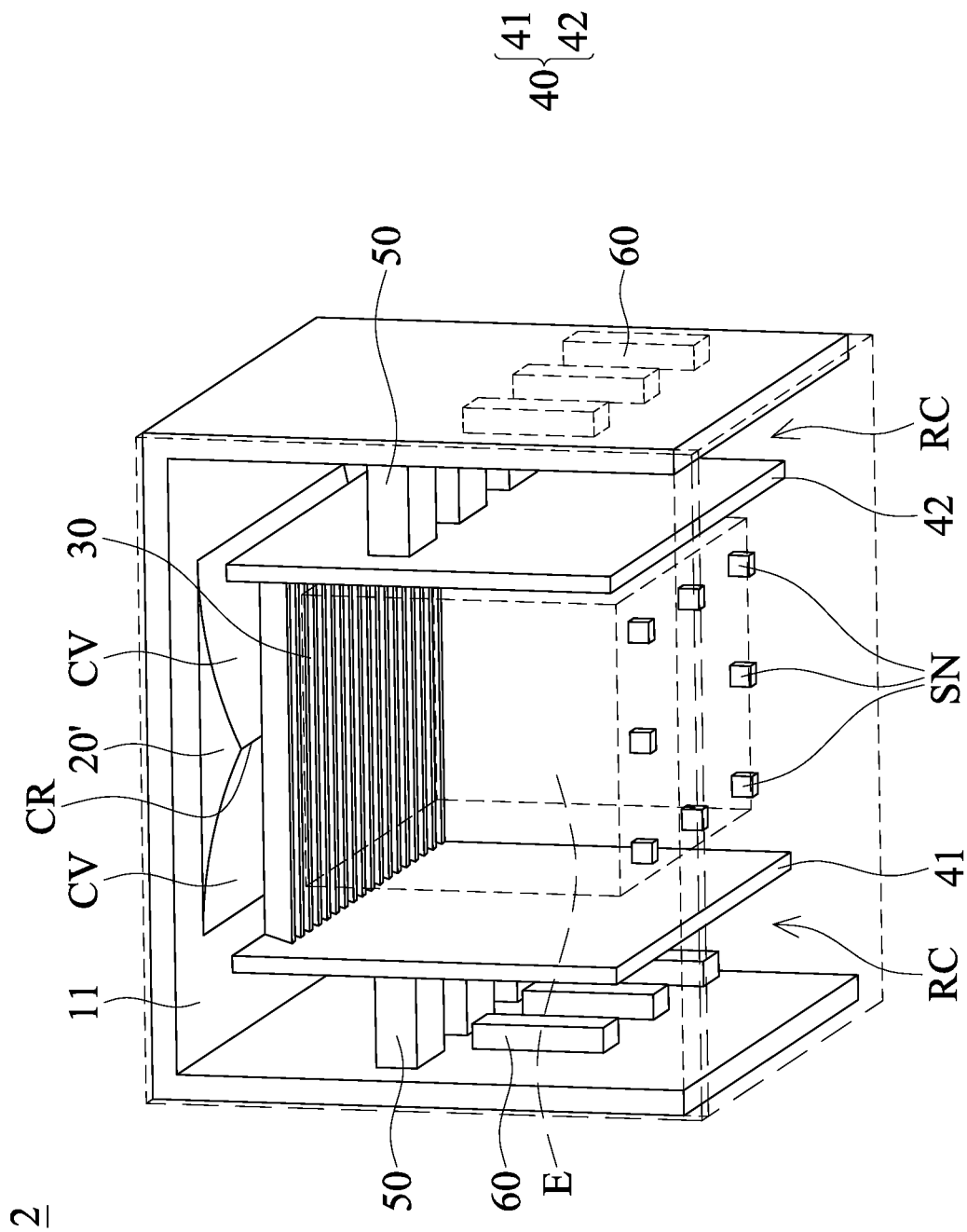
FIG. 8 is a schematic diagram of a burn-in chamber according to another embodiment of the present invention.

FIG. 8 is a schematic diagram showing a burn-in chamber 2 according to another embodiment of the present invention.

The main difference between the burn-in chamber 1" and the burn-in chamber 1 (FIG. 2A) is that the burn-in chamber 2 comprises a guiding plate 20' which is different from the aforementioned guiding plate 20. The other components are the same as, or correspond to, the burn-in chamber 1 of the above-mentioned FIG. 1 and are designated by the same reference numerals and will not be described again. The guiding plate 20' has a guiding curved surface CV, which is different from the planar guiding surface 21 of the guiding plate 20 in FIG. 2A. Through the guiding curved surface CV, the gas generated by the device under test E from the air flow plate 30 can also be smoothly guided to the return channel RC. In detail, the guiding curved surface CV has two arc-shaped structures which are connected to each other to form a ridge CR, wherein the ridge CR is adjacent to the air flow plate 30. Therefore, by the guiding curved surface CV, the gas/air (generated by the device under test E) from the air flow plate 30 can be caused to flow to the second and third walls 11B and 11C, and then to reach the return channel RC.

In summary, the embodiments of the present invention have at least one of the following advantages or effects. The air flow plate, the guiding plate and the return channel can circulate the hot gas/air generated by the device under test in the burn-in chamber, to provide the required temperature in the burn-in chamber. Moreover, in some embodiments, the air flow plate has a downward ventilation structure that allows the hot gas from the device under test to move downwardly, to avoid uneven temperature in the flow channel.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. A burn-in chamber for providing a test temperature of a device under test, comprising:
    a side wall;
    an air flow plate;
    a guiding plate located between the side wall and the air flow plate;
    a partition assembly disposed on both sides of the air flow plate, wherein the partition assembly and the air flow plate together form an accommodating space for accommodating the device under test, and the partition assembly forms a return channel with respect to the other side of the accommodating space with the side wall; and
    a circulating fan assembly disposed in the return channel;
    wherein when the circulating fan assembly is active, air from the accommodating space passes through the air flow plate and is guided to the return channel via the guiding plate, and air is returned to the accommodating space through the return channel;
    wherein the guiding plate has a triangular surface, and a vertex of the triangular surface is adjacent to the air flow plate.

2. The burn-in chamber as claimed in claim 1, wherein the air flow plate further has a ventilation structure inclined with respect to an air inlet direction.

3. The burn-in chamber as claimed in claim 2, wherein the ventilation structure extends toward a bottom side of the guiding plate.

4. The burn-in chamber as claimed in claim 1, wherein the guiding plate is a triangular column structure, a cross section of the triangular column structure is the triangular surface, and the vertex of the triangular surface which is adjacent to the air flow plate is an obtuse angle.

5. The burn-in chamber as claimed in claim 1, further comprising a heater assembly disposed in the return channel.

6. The burn-in chamber as claimed in claim 1, wherein the side wall includes a first wall, a second wall, and a third wall, the first wall is located between and connected to the second wall and the third wall, and the guiding plate is located between the first wall and the air flow plate.

7. The burn-in chamber as claimed in claim 6, further comprising an extractor fan assembly, wherein the side wall further includes an upper wall located above the first wall, the second wall, and the third wall, and the extractor fan assembly is disposed on the upper wall for extracting air in the burn-in chamber.

8. The burn-in chamber as claimed in claim 6, wherein two junctions between the first wall and the second wall and between the first wall and the third wall are a rounded structure, for guiding air from the guiding plate to the return channel.

9. The burn-in chamber as claimed in claim 1, wherein the guiding plate and the air flow plate form a flow channel.

10. The burn-in chamber as claimed in claim 6, wherein the second wall and the third wall each have a vent connected to the return channel, and the vents are configured to introduce air from outside the burn-in chamber into the burn-in chamber.

11. The burn-in chamber as claimed in claim 1, wherein the guiding plate has a guiding curved surface for guiding air into the return channel.

12. The burn-in chamber as claimed in claim 1, wherein the air is provided by the device under test which is placed in the accommodating space.

13. A burn-in chamber for providing a test temperature of a device under test, comprising:
    a side wall;
    an air flow plate;
    a guiding plate located between the side wall and the air flow plate;
    a partition assembly disposed on both sides of the air flow plate, wherein the partition assembly and the air flow plate together form an accommodating space for accommodating the device under test, and the partition assembly forms a return channel with respect to the other side of the accommodating space with the side wall; and a circulating fan assembly disposed in the return channel;

wherein when the circulating fan assembly is active, air from the accommodating space passes through the air flow plate and is guided to the return channel via the guiding plate, and air is returned to the accommodating space through the return channel;

wherein the side wall includes a first wall, a second wall, and a third wall, the first wall is located between and connected to the second wall and the third wall, and the guiding plate is located between the first wall and the air flow plate.

14. The burn-in chamber as claimed in claim 13, wherein the air flow plate further has a ventilation structure inclined with respect to an air inlet direction.

15. The burn-in chamber as claimed in claim 14, wherein the ventilation structure extends toward a bottom side of the guiding plate.

16. The burn-in chamber as claimed in claim 13, further comprising a heater assembly disposed in the return channel.

17. The burn-in chamber as claimed in claim 13, further comprising an extractor fan assembly, wherein the side wall further includes an upper wall located above the first wall, the second wall, and the third wall, and the extractor fan assembly is disposed on the upper wall for extracting air in the burn-in chamber.

18. The burn-in chamber as claimed in claim 13, wherein the second wall and the third wall each have a vent connected to the return channel, and the vents are configured to introduce air from outside the burn-in chamber into the burn-in chamber.

19. The burn-in chamber as claimed in claim 13, wherein the guiding plate has a guiding curved surface for guiding air into the return channel.

20. The burn-in chamber as claimed in claim 13, wherein the guiding plate and the air flow plate form a flow channel.

* * * * *